(12) United States Patent
Machida et al.

(10) Patent No.: US 6,984,552 B2
(45) Date of Patent: Jan. 10, 2006

(54) METHOD FOR DOPING SEMICONDUCTOR LAYER, METHOD FOR PRODUCING THIN FILM SEMICONDUCTOR ELEMENT AND THIN FILM SEMICONDUCTOR ELEMENT

(75) Inventors: Akio Machida, Kanagawa (JP); Setsuo Usui, Kanagawa (JP); Dharam Pal Gosain, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/433,849

(22) PCT Filed: Dec. 7, 2001

(86) PCT No.: PCT/JP01/10726

§ 371 (c)(1),
(2), (4) Date: Dec. 15, 2003

(87) PCT Pub. No.: WO02/47138

PCT Pub. Date: Jun. 13, 2002

(65) Prior Publication Data

US 2004/0110343 A1 Jun. 10, 2004

(30) Foreign Application Priority Data

Dec. 7, 2000 (JP) .............................. 2000-373052

(51) Int. Cl.
 *H01L 21/00* (2006.01)
 *H01L 21/84* (2006.01)
(52) U.S. Cl. ..................... 438/166; 438/164; 257/66; 257/72
(58) Field of Classification Search ........ 438/166–160, 438/151; 257/66, 72–75
See application file for complete search history.

(56) References Cited

U.S. PATENT DOCUMENTS

| 5,858,819 A | * | 1/1999 | Miyasaka ................ 438/149 |
| 6,426,245 B1 | * | 7/2002 | Kawasaki et al. .......... 438/166 |
| 6,444,507 B1 | * | 9/2002 | Miyasaka ................ 438/164 |

FOREIGN PATENT DOCUMENTS

| JP | 57-202729 | 12/1982 |
| JP | 64-11323 | 1/1989 |
| JP | 03-218622 | 9/1991 |
| JP | 04-48723 | 2/1992 |
| JP | 07-135170 | 5/1995 |

* cited by examiner

*Primary Examiner*—Dung A. Le
(74) *Attorney, Agent, or Firm*—Sonenschein, Nath & Rosenthal LLP

(57) ABSTRACT

A low concentration impurity diffusion region is formed with good controllability even in case of using a low heat resistant substrate. When doping a semiconductor layer, after forming the semiconductor layer on the substrate, the amount of the dopant ion adsorbed on a surface of the semiconductor layer is controlled by introducing hydrogen gas at the time of plasma irradiation and activating the adsorbed dopant ion in the semiconductor layer by an excimer laser.

16 Claims, 12 Drawing Sheets

METHOD FOR DOPING SEMICONDUCTOR LAYER, METHOD FOR PRODUCING THIN FILM SEMICONDUCTOR ELEMENT AND THIN FILM SEMICONDUCTOR ELEMENT

BACKGROUND OF THE INVENTION

The present invention relates to a method for doping a semiconductor layer, a method for manufacturing a thin film semiconductor device, method for controlling resistance of a semiconductor layer, and a thin film semiconductor device, and more particularly, a doping method using a crystallized semiconductor layer by excimer laser anneal, a method for manufacturing a thin film semiconductor device such as a thin film transistor, a thin film semiconductor device in which a semiconductor layer made of such as polycrystalline silicon is used as a channel.

With progress of an advanced information age, the importance of input/output devices is increasing rapidly and the devices are in demand to include advanced and sophisticated features. Furthermore, the spread of personal digital assistant machines is remarkable in recent years, and consequently, the technology of producing TFT on a plastic substrate with more excellent weight saving, flexibility, and non-destructivity rather compared with a glass substrates is desired. In such a situation, research and development of active matrix liquid crystal display devices (AM-LCD) using a thin film transistor (TFT) and contact image sensors (CIS) and the like are actively done.

The thin film transistors, in which a semiconductor film made of silicon is used as a channel, can be classified by a material used in order to form a carrier-transporting layer (active layer), that is, a semiconductor film made of amorphous silicon (a-Si) and a semiconductor film made of polycrystalline silicon having a crystal phase. Polysilicon (poly-Si) or microcrystal silicon ($\mu$c-Si) is mainly known as the polycrystalline silicon.

Semiconductors made of the polycrystalline silicon such as polysilicon (poly-Si) or microcrystal silicon ($\mu$c-Si) are characterized by the carrier mobility from about 10 to 100 times as high as that of semiconductors made of amorphous silicon, and have very excellent characteristics as a composition material of switching elements. Moreover, the thin film transistors using the polycrystalline silicon for the active layer allow high-speed operation, and therefore are getting most of the attention as the switching elements constituting various logical circuits (for example, a domino logic circuit, a CMOS (Complementary Metal Oxide Semiconductor) transmission gate circuit), multiplexers using these circuits, EPROM (Erasable and Programmable Read Only Memory), EEPROM (Electrically Erasable and Programmable Read Only Memory), CCD (Charge Coupled Device), RAM (Random Access Memory), drive circuits of displays such as a liquid crystal display and an electroluminescent display, and the like in recent years. Moreover, recently, remarkable are active matrix liquid crystal displays employing the thin film transistor (TFT), using such polysilicon for a channel semiconductor film, as the switching element and as a peripheral drive circuit. This is because the constitution of a thin film transistor array, making use of a polysilicon semiconductor film which can be formed at a low temperature on a cheap amorphous glass substrate, may allow to implement reflective panel displays or wide, high-finesse, high-definition and cheap panel displays (for example, a flat type television).

On the other hand, when using poly-Si TFT in switching elements for pixel selection of the liquid crystal display or the like, the off current is high and display quality is low, which is a problem. In conventional MOS transistors using single crystal silicon, when a gate reverse bias is applied to a gate, a leakage current does not increase, since the channel become a opposite polarity with a source or a drain, a depletion layer is formed and enough pressure-proofing and rectification property is shown. However, with the poly-Si TFT, a problem arises that a high leakage current occurs since current flows through the grain boundary of crystalline particles composing the semiconductor film or through the defects of the particles themselves. Furthermore, since the MOS transistors are not used under very high gate reverse bias, the leakage current has not become a problem. However, in the poly-Si TFT using for the active matrix liquid crystal displays, for example, the leakage current poses a big problem since it is used under the reverse bias of about 10 V or more. Such a problem is especially important for the thin film transistor for pixel selection of the liquid crystal displays in which the poly-Si is used.

In order to reduce the leakage current, it is effective to relax the electric field in the drain edge, and it has been known that LDD (Lightly Doped Drain) structure is effective (General Conference of The Institute of Electronics and Communication Engineers, 2–20, pp. 271, 1978). The structure forms the region which activated the impurities under a low dose such as $1\times10^{14}/cm^2$ or less in the edge of the drain region to relaxes the electric field in the edge of the drain region.

The thin film transistor having the LDD structure is formed, for example, by the following processes so far. First, an amorphous silicon containing hydrogen (a-Si:H) film is formed on a glass substrate, and is dehydrogenated by the lamp anneal. Then, a polysilicon (poly-Si) semiconductor film is formed by crystallizing the amorphous silicon film by laser irradiation. Then, a gate insulating film and a gate electrode are formed, and heavy doping of impurity ion is performed by using the gate electrode as a mask where the gate electrode has already been patterned to cover a channel region and an LDD region. Subsequently, the gate electrode is patterned again to cover only the channel region. Further, light doping of impurity ion is performed by using the re-patterned gate electrode as a mask. Consequently, source and drain regions having the LDD structure is formed. Such processes have been disclosed in Japanese Unexamined Patent Application No. 2000-228526.

When forming the thin film transistor having the LDD structure by such a method, there is a problem of the difference or the variation in lengths of the LDDs on both sides of the channel region (thicknesses of the LDD regions between the channel regions and contact regions) due to deviation of the mask during patterning of the gate electrode, and the like. This causes other problems that the characteristics of the thin film transistor vary and the productivity of the thin film transistor decrease. Moreover, the LDD lengths cannot be set to about 2 $\mu$m or less in order to secure a mask alignment margin. For this reason, the resistance of the LDD regions becomes high, and the carrier mobility decreases, which is a problem. Therefore, it is important to develop the self-alignment type process where the controllability of the LDD lengths is enough at a low dose such as $1\times10^{14}/cm^2$ or less.

By the way, as for the poly-Si TFT, the highest process temperature reaches about 1000° C. in the manufacturing process. Therefore, silica glasses or the like having an excellent heat resistance are used as an insulating substrate for manufacturing the poly-Si TFT. That is, it is difficult to use a glass substrate with a comparatively low melting point in the manufacturing process. However, for a cost reduction of the liquid crystal displays, the use of the glass plate materials with a low melting point is indispensable. Then, in recent years, the development of the so-called low temperature process with the highest process temperature of 600° C. or below is making progress, and the production of such devices is practically done. Furthermore, recently, using a plastic substrate which is easy to form a larger area under lower temperature has been also examined. The deformation temperature of the plastic substrate is at most 200° C., even when formed from a heat resistant material. Therefore, when the substrate is formed from the plastic, all processes must be performed on the condition of super low temperature as compared with the conventional conditions, that is, at 200° C. or below.

With the larger type of liquid crystal display, in the low temperature process for the poly-Si TFT, the ion doping and the plasma doping, which allow doping impurities into the semiconductor thin film with a large area with a fine throughput, are used. The ion doping is the method of ionizing an impurity gas and then irradiating the impurity ion all at once onto the large area semiconductor thin film by accelerating electric field without performing a mass separation. The plasma doping is the method of ionizing an impurity gas and a deposition gas simultaneously, and deposit including the impurity ion on the substrate surface. On the other hand, ion implantation is the method of performing the mass separation of impurity ion, producing an ion beam of the separated ion and irradiating the ion beam onto the semiconductor thin film. Although the ion doping and the plasma doping are advantageous to the formation of the larger area type, these processes pose problems that the film can contain hydrogen in large quantities which can blow off and break the film at the time of crystallization by the excimer laser (ELA: Excimer Laser Anneal), and that it is difficult to perform the lower temperature process using the plastic substrate or the like at the required temperature for dehydrogenation (400° C.). Moreover, there is also a problem that these methods are not suitable for the self-alignment type process in principle.

By the way, the Laser-Induced Melting of Predeposited Impurity Doping (LIMPID) attracts attention recently as being a method in which doping can be done in a process at 200° C. or below. The LIMPID is the method of ionizing an impurity gas, adsorbing the impurity ion on the surface of the semiconductor thin film, and melting the ion into the film with an excimer laser, and attracts attention not only because the hydrogen cannot be entrapped into the film, but also because it is most appropriate to the self-alignment process as well as to the low temperature process (refer to Japanese Unexamined Patent Application No. SHO 61-138131, Japanese Unexamined Patent Application No. SHO 62-002531, Japanese Unexamined Patent Application No. SHO 62-264619, and Japanese Unexamined Patent Application No. HEI 9-293878).

With the LIMPID, the high dose such as from about $1 \times 10^{15}$ to $1 \times 10^{16}/cm^2$ of the impurities can be electrically activated in the semiconductor thin film. However, in principle, it is difficult to precisely control the dose of $1 \times 10^{14}/cm^2$ or less of the impurities. Because the high dose of from about $1 \times 10^{15}$ to $1 \times 10^{16}/cm^2$ of the impurities is activated by the excimer laser anneal, even when, for example, the impurity ion of an atomic layer are adsorbed on the top of Si surface. Furthermore, since the adsorption of the impurity ion of the atomic layer occurs for an extremely short time in the conventional methods, the control at the low dose is difficult.

FIG. 13 shows a sheet resistance $\rho_s$ in a case where the anneal is performed by use of the excimer laser after adsorbing phosphorus by plasma irradiation. The sheet resistance $\rho_s$ is measured by changing the partial pressure of phosphine ($PH_3$) by an argon gas as an inert gas. The conditions of the plasma irradiation are as follows: the flow rate of argon gas is 5 to 150 sccm, the flow rate of phosphine and hydrogen is 3 to 10 sccm, the total pressure is 63 Pa (475 mTorr), the substrate temperature is 130° C., RF power is 20 W and the irradiation time is 1 minute. The anneal is performed by use of XeCl excimer laser of 308 nm in wavelength, with the energy density of 300 mJ/cm$^2$ and the overlap ratio is 98%. As seen in FIG. 13, even when the partial pressure of phosphine is changed, the sheet resistance $\rho_s$ changes little and it reveals that controlling the partial pressure cannot control the concentration of impurities in an impurity diffusion region.

On the other hand, the conventional ion implantation is the most appropriate to the self-alignment process and enables also the control at a low dose. Since the substrate temperature generally increases in the process for the silicon substrate, the method of attaching a cooling plate by the electrostatic chuck of the substrate and radiating heat from the back side thereof is taken in the process. However, it is difficult to apply such a method to the plastic substrate considering the thermal conductivity and electrical conductivity of the plastic substrate. Moreover, there are other problems that the impurities cannot be implanted into the semiconductor thin film with the large area all at once, and that the throughput gets worse in the manufacturing the large-sized liquid crystal displays.

The present invention has been achieved in view of the above problems. It is an object of the invention to provide a method for doping a semiconductor layer which can form a lower concentration impurity diffusion region under excellent controllability even when a low heat resistant substrate is used, a method for manufacturing a thin film semiconductor device, a method for controlling resistance of a semiconductor layer, and a thin film semiconductor device.

SUMMARY OF THE INVENTION

A method for doping a semiconductor layer of the invention comprises the steps of: forming a semiconductor layer on a substrate; adsorbing dopant ion on a surface of the semiconductor layer and controlling the amount of the adsorption; and activating the adsorbed dopant ion in the semiconductor layer.

A method for controlling the amount of the dopant ion adsorbed on the surface of the semiconductor layer includes, for example, a method for controlling the rate of termination in a dangling bond of the materials forming the semiconductor layer, and a method of selectively removing the dopant ion adsorbed on the surface of the semiconductor layer by etching. Examples of the method for controlling the rate of the termination in the dangling bonds are adsorbing the hydrogen ion on the ends of the dangling bonds and are changing the substrate temperature on which the semiconductor layer is formed. Concretely, a method of diluting the dopant ion gas to be adsorbed with hydrogen gas or mixed gas of hydrogen gas and inert gas to have 1% or less of the concentration of the dopant ion can be used.

According to the method for doping the semiconductor layer of the invention, the dopant ion is adsorbed on the surface of the semiconductor layer formed on the substrate. The amount of the dopant ion is controlled so that the amount to be activated after introducing the semiconductor layer is precisely controlled, thereby the low concentration impurity diffusion is formed on particularly a low heat resistant substrate with good reproducibility.

Further, a method for manufacturing a thin film semiconductor device and a method for controlling resistance in the semiconductor layer of the invention comprises the steps of: forming a semiconductor layer on a substrate; adsorbing dopant ion on a surface of the semiconductor layer and controlling the amount of the adsorption; and activating the adsorbed dopant ion in the semiconductor layer. A thin film semiconductor device of the invention is manufactured with the above manufacturing method.

Other and further objects, features and advantages of the invention will appear more fully from the following description.

BRIEF DESCRIPTION OF THE DRAWINGS

FIG. 1A is a view illustrating the state of a surface of a silicon layer before ion adsorption, FIG. 1B is a view illustrating the state of the surface of the silicon layer in which phosphorus ion and hydrogen ion is adsorbed, and FIG. 1C is a view illustrating the step of activation by irradiation of excimer laser.

FIG. 10A is a view illustrating the steps until forming a semiconductor polycrystalline film, FIG. 10B is a view illustrating the steps until crystallizing a semiconductor film, and FIG. 10C is a view illustrating the steps until adsorbing dopant ion and hydrogen ion.

FIG. 11A is a view illustrating the steps until activating the semiconductor polycrystalline film, FIG. 11B is a view illustrating the steps until high concentration doping to the semiconductor thin film, and FIG. 11C is a view illustrating the steps until wiring of the thin film transistor.

DETAILED DESCRIPTION OF THE PRESENTLY PREFERRED EMBODIMENTS

An embodiment of a method for doping a semiconductor layer according to the invention will be described in detail hereinbelow with reference to FIGS. 1A to 1C. The method for doping the semiconductor layer of the embodiment can form a low concentration impurity diffusion region in a silicon layer formed on a low heat resistant insulating substrate such as plastic or the like with good controllability.

Figure 1A:
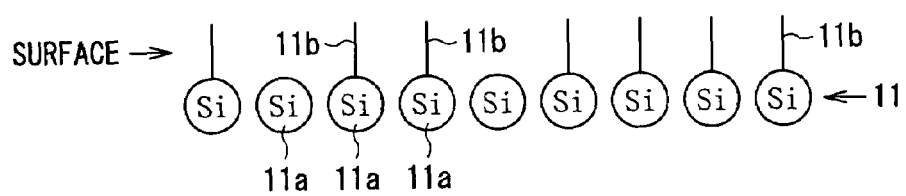
FIGS. 1A to 1C are views illustrating the steps in a method for doping a semiconductor layer according to an embodiment of the invention.

First, as shown in FIG. 1A, a silicon layer 11 as a semiconductor layer is formed on an insulating substrate 10 (refer to FIG. 1C) and is crystallized by laser beam irradiation of excimer laser at this time. In the surface of the silicon layer 11, a lot of silicon atoms 11a exist in microcrystalline form and dangling bonds 11b exist in some of the silicon atoms 11a.

Figure 1B:
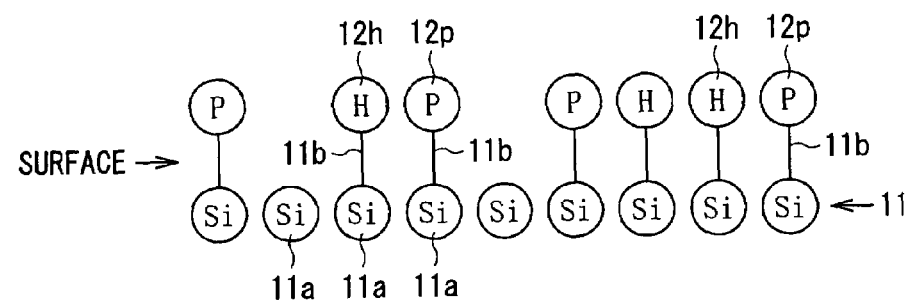
Figure 13:
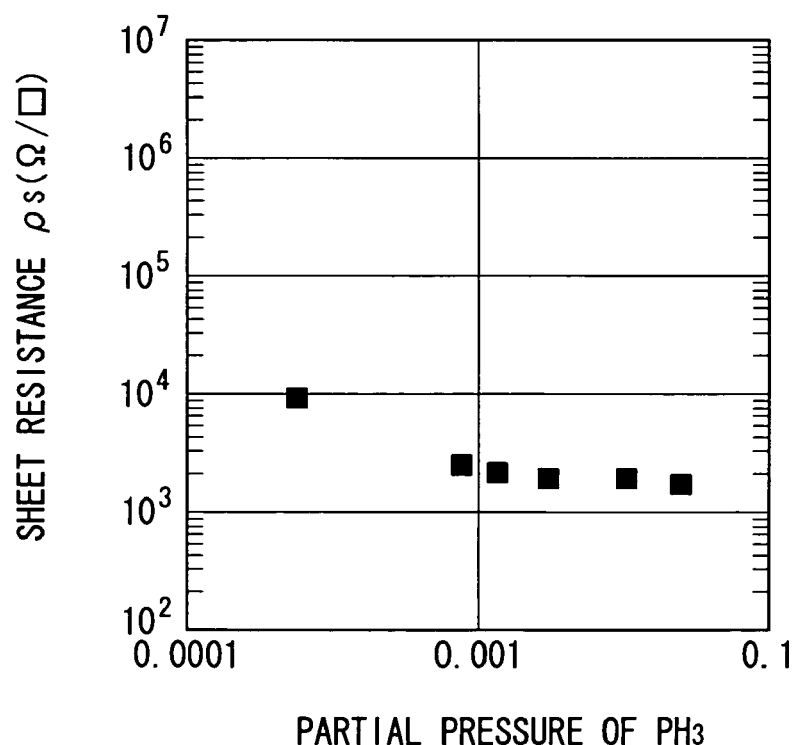
FIG. 13 is a characteristic view illustrating the relation of $PH_3$ partial pressure and the sheet resistance in the conventional process.

Next, as shown in FIG. 1B, dopant gas ion is adsorbed to terminate the dangling bonds 11b on the surface of the silicon layer 11 by plasma of dopant gas without semiconductor deposition gas. The dopant gas is a gas which dilute $PH_3$ gas containing phosphorus ion 12p with hydrogen $H_2$. The phosphorus ion 12p and hydrogen ion 12h exist in the plasma gas. Each of the phosphorus ion 12p and the hydrogen ion 12h are adsorbed on the surface of the silicon layer 11 to terminate the dangling bonds 11b. When only the phosphorus ion 12p exist, the phosphorus ion 12p is adsorbed on most of the dangling bonds 11b on the surface of the silicon layer 11. In this case, it is difficult to form the low concentration diffusion region even when the partial pressure of phosphoric gas is reduced with an inert gas (refer to FIG. 13). On the other hand, in the embodiment, the hydrogen ion 12h controls the rate in which the dangling bonds 11b are terminated by the phosphorus ion 12p and the concentration of the phosphorus ion 12p on the surface of the silicon layer 11 can be reduced during the adsorption.

Figure 1C:
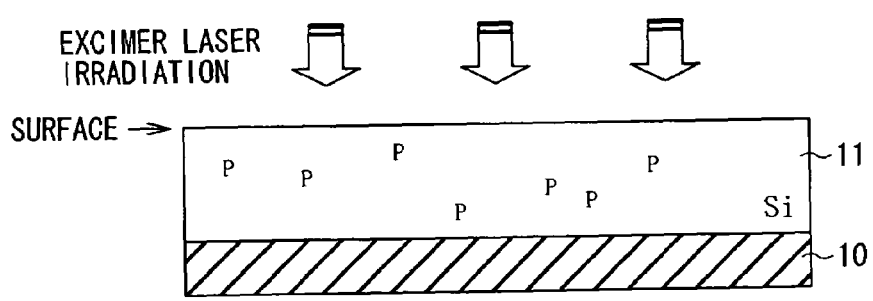

Subsequently, as shown in FIG. 1C, the excimer laser beam is irradiated on the surface of the silicon layer 11 formed on the insulating substrate 10 to diffuse the phosphorus ion 12p adsorbed on the surface of the silicon layer 11 into the silicon layer 11. By the excimer laser irradiation, the silicon layer fuses instantly and the adsorbed phosphorus ion 12p is dissolved in the film. At this time, the hydrogen ion 12h which terminate some of the dangling bonds 11b are gasified and evaporated in an atmosphere of gas as $PH_3$ gas, whereas the phosphorus ion 12p is diffused in the silicon layer 11. Thereby the low concentration impurity diffusion region is formed. Since the hydrogen ion 12h is adsorbed to terminate the dangling bonds 11b, the phosphorus ion 12p is diffused with low concentration and especially, when forming the LDD structure of TFT in the silicon layer 11, the low concentration impurity region is formed with good controllability.

In the doping method of the embodiment, the dopant ion gas is diluted by flowing the gas which adsorb the hydrogen ion to control the amount of the dopant ion adsorbed on the surface of the semiconductor layer. In addition, changing the substrate temperature, controlling the flow rate or partial pressure of gas, further diluting the mixed gas of dopant ion gas and hydrogenous gas with an inert gas, and controlling the conditions of the plasma irradiation for adsorption may be applicable to control the amount of the dopant ion. Further, the dopant ion adsorbed on the surface of the semiconductor layer can be removed by etching or the like and the hydrogen plasma treatment can be added to control the amount of the dopant ion. In addition, a method of removing the dopant ion by etching or the like can be performed with combination of a method of controlling the flow rate or the partial pressure of gas, or controlling the substrate temperature.

By mixing the hydrogen gas to the dopant gas, hydrogen passivation is generated concurrently with the adsorption of dopant ion on the surface of the silicon layer during the plasma treatment. In order to make the doping ion adsorb to the dangling bonds of the hydrogen-passivated silicon, it is necessary to cut the bond of Si and H. In this case, inhibiting the adsorption speed of the doping ion to improve the process controllability. In the meanwhile, hydrogen adsorbed on the silicon surface around room temperature is relatively stable and specifically, when hydrogen and phosphorus are adsorbed together, it forms P—Si—H complex and the dissociation energy of hydrogen increases, thereby Si—H bond is stable. However, this Si—H bond is easily broken when the substrate temperature becomes about 100° C. In order to form the low temperature impurity diffusion region of the LDD structure, it is necessary to reduce the adsorption amount of phosphorus. This can be achieved by irradiating plasma gas containing doping gas and a large amount of hydrogen around room temperature. On the other hand, in order to form the high concentration impurity diffusion region as the source and drain regions, it is necessary to increase the adsorption amount of phosphorus. This can be achieved by decreasing the concentration of hydrogen to raise the substrate temperature and irradiating plasma to the raised substrate. Thereby, the resistance of thin film after the excimer laser anneal can be controlled with good accuracy.

Further, the adsorbed dopant ion is activated by irradiation of energy beam like excimer laser as shown in FIG. 1C, and the activation of the dopant ion and the recrystallization of the semiconductor layer on the substrate can be performed simultaneously. An example of the energy beam to be used for activation of the dopant ion or the recrystallization of the semiconductor layer on the substrate is excimer laser such as ArF excimer laser, XeF excimer laser, XeCl excimer laser, KrF excimer laser and the like. The dopant ion may be activated by using the heating methods such as lamp anneal, furnace anneal and the like in addition to the energy beam such as excimer laser.

When controlling the conditions of the plasma irradiation during the dopant ion adsorption, plasma can be generated from the mixed gas of doping gas and hydrogen gas or mixed gas of inert gas and hydrogen gas to irradiate plasma. In addition to this, hydrogen plasma irradiation may be performed before or after the plasma irradiation with a gas containing doping gas. In general, the higher the concentration of hydrogen gas which dilutes the doping gas is, the lower the concentration of impurity diffusion is, and the lower the temperature of the surface of the semiconductor layer is, the lower the concentration of impurity diffusion is. The conditions of the plasma irradiation include flow rate and pressure of mixed gas containing dopant gas and hydrogen gas, substrate temperature, irradiation time, RF power or the like. Controlling these conditions alone or in combination enables to form the low concentration impurity diffusion region with good reproducibility.

The inventors of the present invention have experimented various methods for controlling the amount of dopant ion adsorbed on the surface of the semiconductor layer by controlling the diluted gas, the plasma irradiation time, the substrate temperature, and the hydrogen plasma treatment. Here, data obtained form the results of the experiments will be described with reference to FIGS. 2 to 6.

Figure 2:
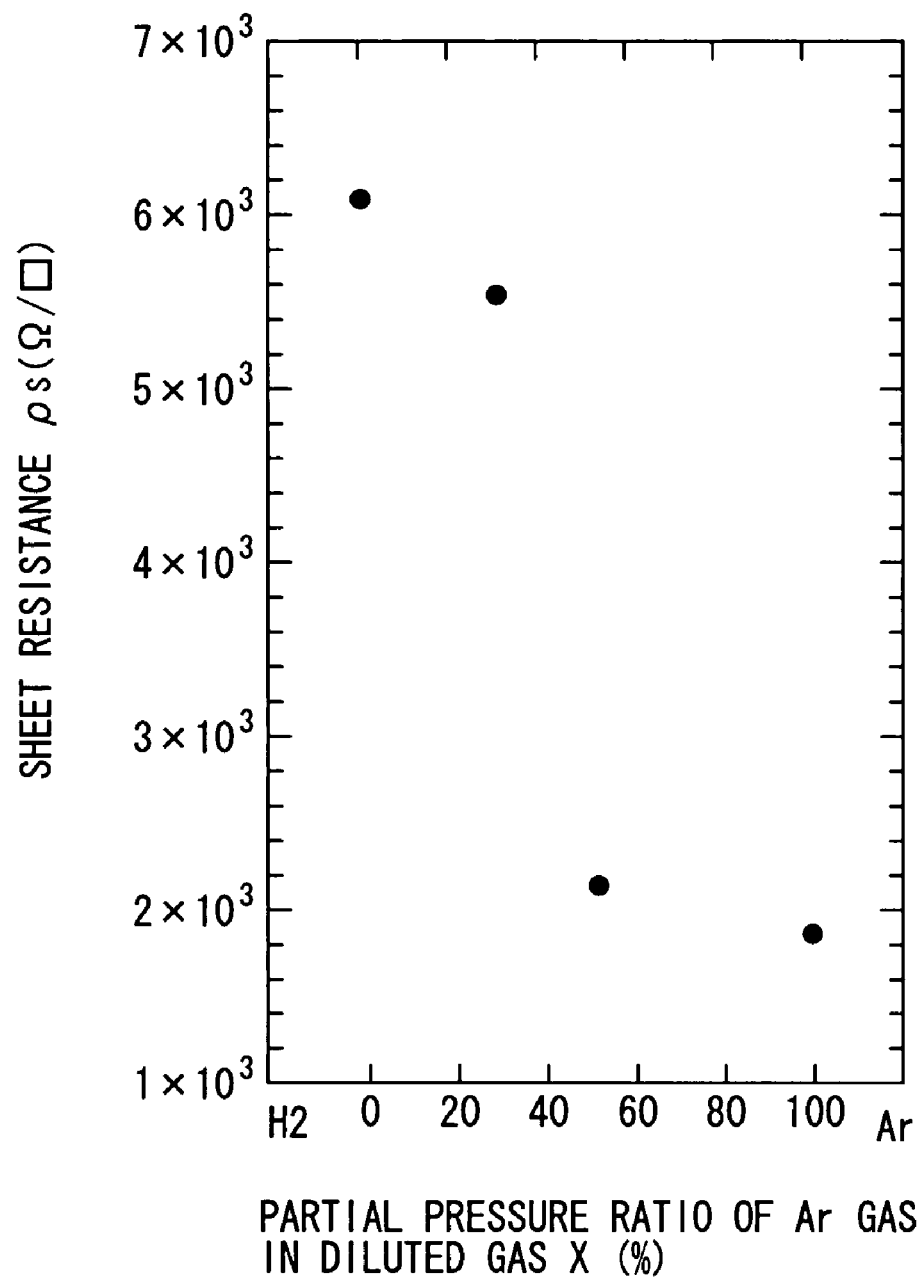
FIG. 2 is a characteristic view illustrating the relation of the mixture ratio of diluted gas and the sheet resistance according to an example of the invention.

Phosphine ($PH_3$) was used as the dopant gas and was diluted with a hydrogen gas ($H_2$) and an argon gas (Ar) to have the concentration of about 1% and the plasma was irradiated to a nonsingle crystal silicon film with a thickness of 70 nm with the gas. The sheet resistance $\rho_s$ was measured. The results are shown in FIG. 2. The mixed gas of argon gas and hydrogen gas as the inert gas was mixed by varying the hydrogen partial pressure from 0% (argon partial pressure of 100%) to 100% (argon partial pressure of 0%). The horizontal axis indicates the mixture ratio of the mixed gas of dopant gas containing hydrogen and argon (partial pressure ratio of argon gas Ar) and the vertical axis indicates the sheet resistance $\rho_s$. The gas containing phosphine ($PH_3$) and about 99% of hydrogen gas ($H_2$) is 9.2 Pa (69 mTorr) and the partial pressure of argon gas in the mixed gas of argon and hydrogen is 54.1·X Pa (406·X mTorr) (X is numeric value (%)). The partial pressure of hydrogen gas in the mixed gas of argon and hydrogen is 54.1·(100-X) Pa (406·(100-X) mTorr) (X is numeric value (%)).

As seen in FIG. 2, high resistance of about $5 \times 10^3$ to $6 \times 10^3 \Omega/cm^2$ can be achieved particularly in the region where the partial pressure of argon gas is low, that is, the partial pressure of hydrogen gas is high and this is the effect of the dilution of dopant gas with the hydrogen gas. Namely, the existence of hydrogen gas allows the adsorption of the hydrogen gas on the thin film semiconductor film with high ratio and reduction of phosphorus concentration to achieve the high resistance.

Figure 3:
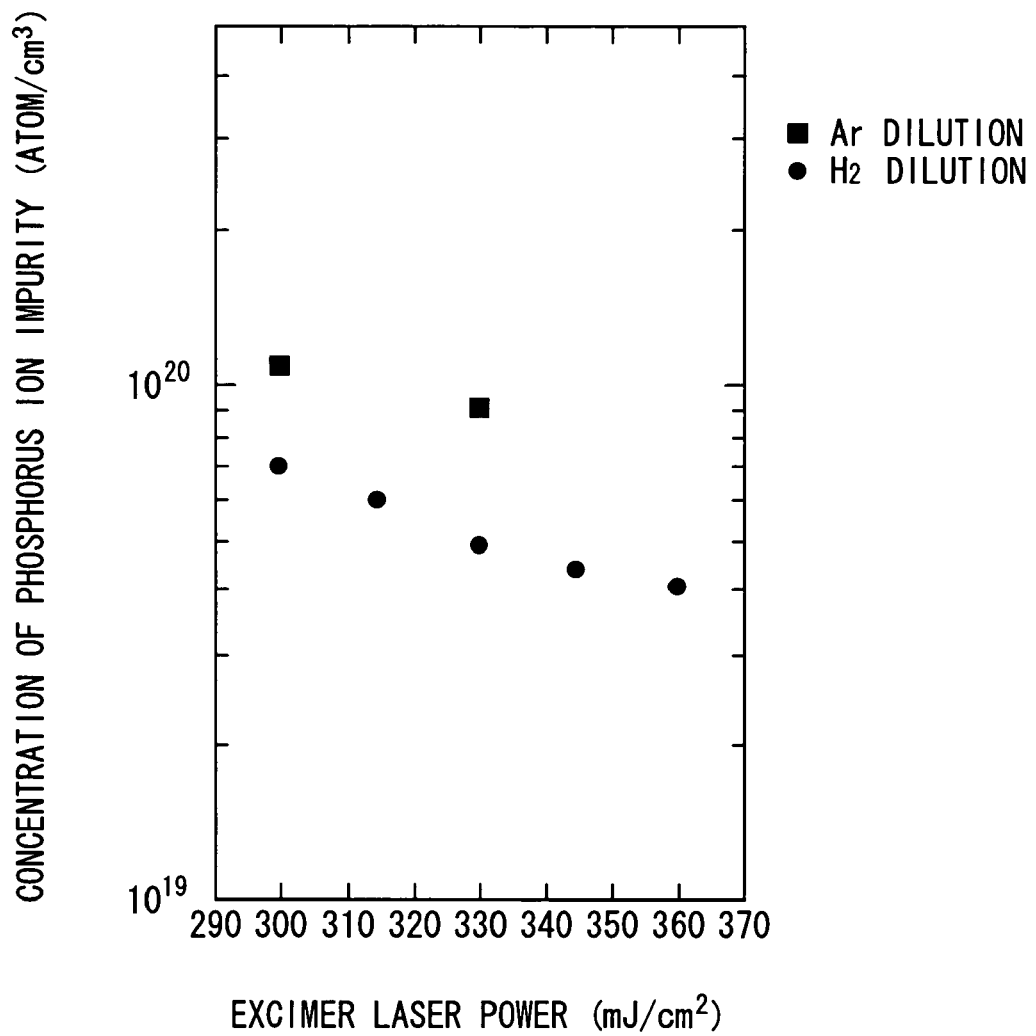
FIG. 3 is a characteristic view illustrating the relation of the mixture ratio of diluted gas and the concentration of phosphorus according to the example of the invention.

FIG. 3 shows a change in the concentration of phosphorus ion to the energy density ($mJ/cm^2$) of the excimer laser. The points indicated by black squares have the argon partial pressure of 100% and the points indicated by black circles have the hydrogen partial pressure of 100%. The lower the energy density of the excimer laser is, the higher the concentration of phosphorus ion is. The case where the argon partial pressure is 100% has higher concentration of phosphorus ion compared to the case where the hydrogen partial pressure is 100%. When forming the low concentration impurity diffusion region, the hydrogen partial pressure higher than the argon partial pressure is preferable.

Figure 4:
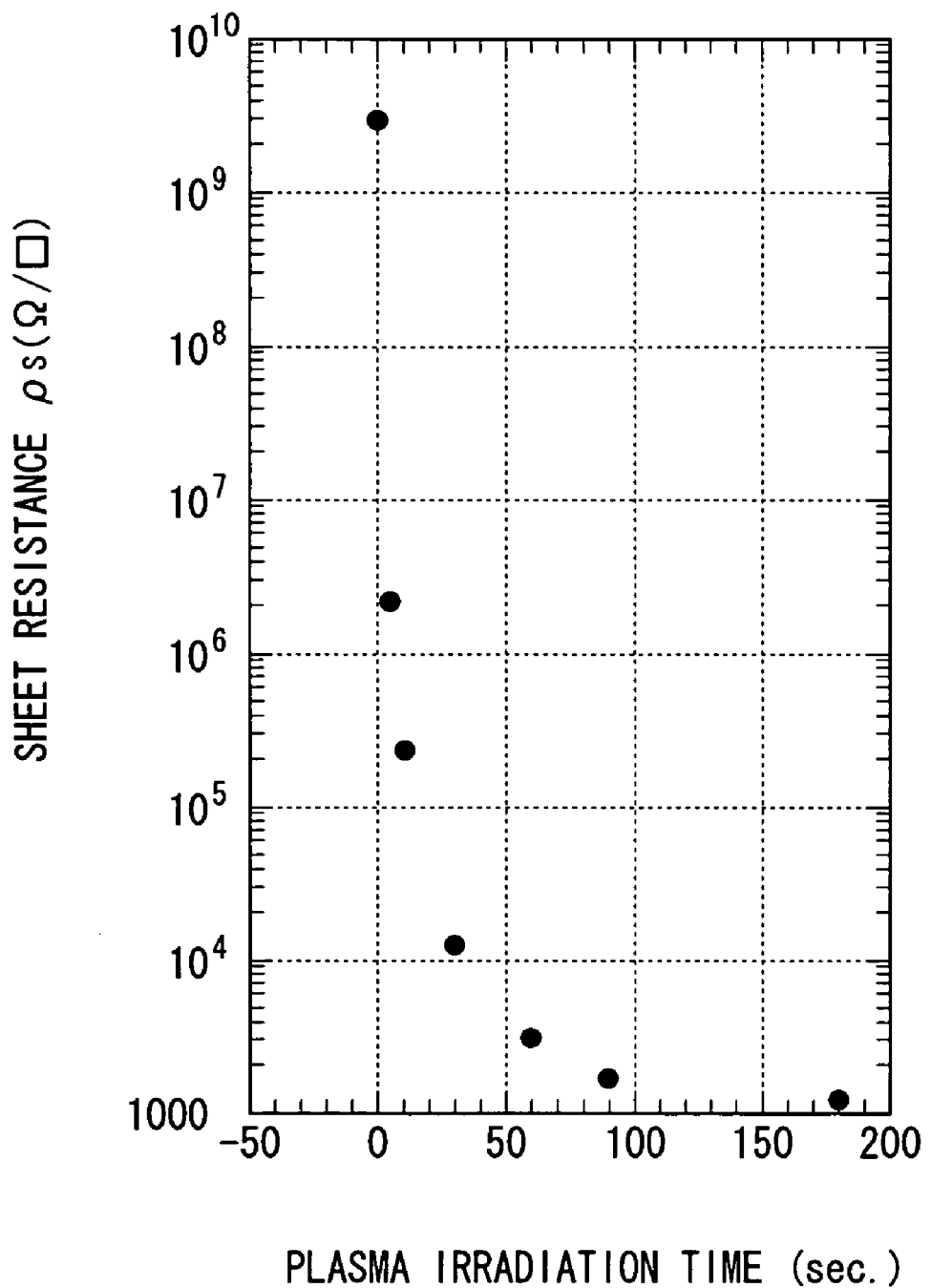
FIG. 4 is a characteristic view illustrating the relation of the sheet resistance and the plasma irradiation time according to the example of the invention.

The inventors of the present invention have experimented the relation of plasma irradiation time and the sheet resistance as shown in FIG. 4. This experiment was carried out to improve the adsorption of phosphorus controlled by the plasma irradiation time and the activation by the excimer laser anneal of the 70 nm-thick nonsingle crystal silicon film. The horizontal axis indicates plasma irradiation time (second) and the vertical axis indicates the sheet resistance $\rho_s$ ($\Omega/\square$). As seen in FIG. 4, the longer the plasma irradiation time is, the lower the sheet resistance $\rho_s$ is. This reveals that the high resistance of the impurity diffusion region is achieved by shortening the plasma irradiation time. The decrease of the sheet resistance $\rho_s$ substantially indicates exponential change and within the short time after starting the irradiation, the resistance decreases significantly. In this experiment, the conditions of the plasma irradiation other than irradiation time were as follows: the flow rate of the mixed gas of phosphine ($PH_3$) and 99% of hydrogen ($H_2$) was 10 sccm, the flow rate of argon gas was 50 sccm, the pressure was 63.3 Pa (475 mTorr), the substrate temperature was 130° C. and the RF power was 20 W. The XeCl excimer laser (wavelength of 308 nm) was used as the excimer laser in terms of the condition of the excimer laser anneal for activation and the XeCl excimer laser was irradiated sequentially with 98% overlap.

Figure 5:
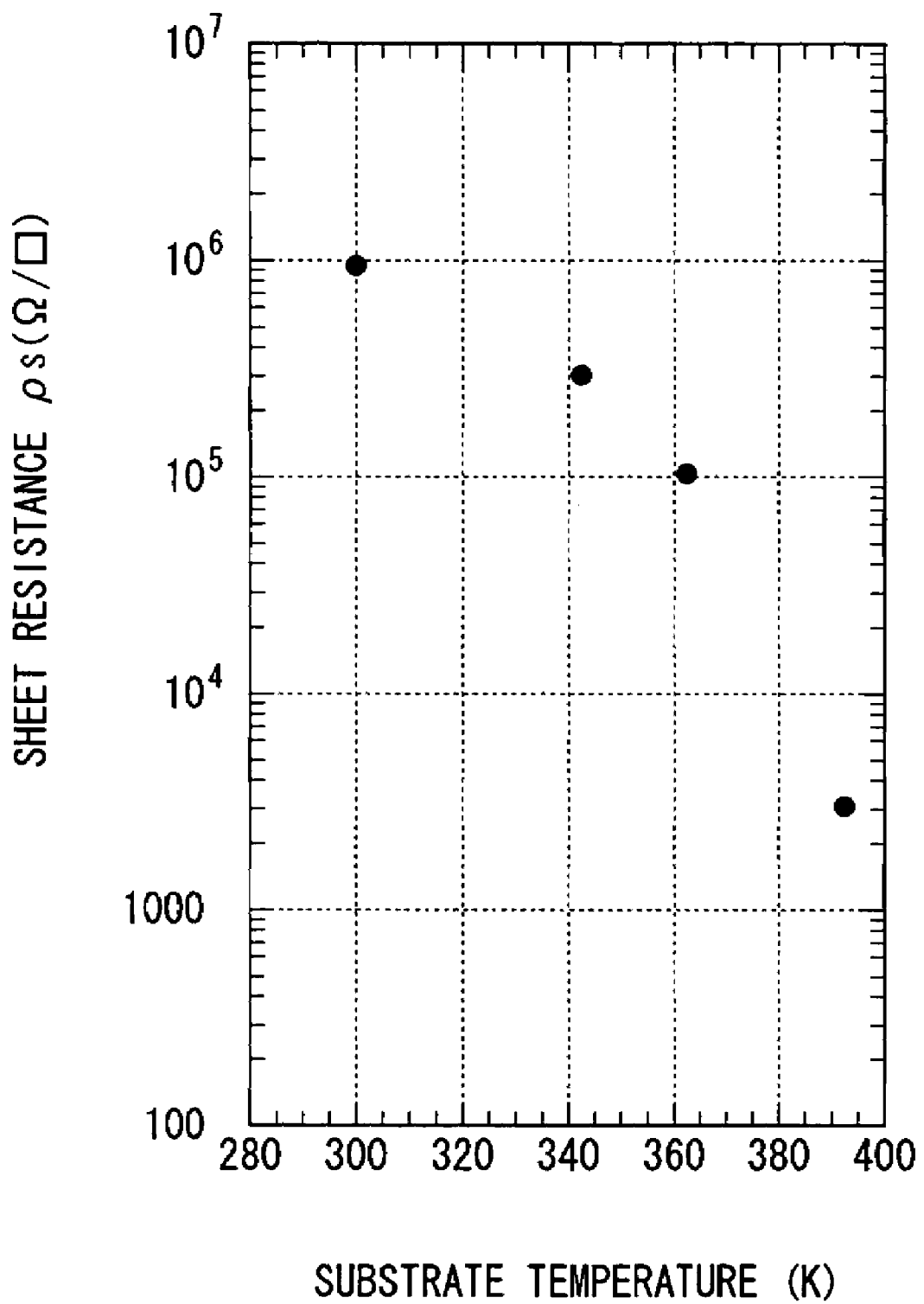
FIG. 5 is a characteristic view illustrating the relation of the substrate temperature and the sheet resistance according to the example of the invention.

The experiment reveals that as a method for controlling the amount of dopant ion adsorbed on the surface of the semiconductor layer, the control of the substrate temperature during the plasma irradiation is also effective. FIG. 5 shows the results of the measurement of a change in the sheet resistance $\rho_s$ of the nonsingle crystal silicon layer with a film thickness of 70 nm by changing the substrate temperature (K). The horizontal axis indicates the substrate temperature (K) and the vertical axis indicates the sheet resistance $\rho_s$ ($\Omega/\square$). As seen in FIG. 5, the higher the substrate temperature during the plasma irradiation is, the lower the sheet resistance $\rho_s$ is. The high resistance of the impurity diffusion region can be achieved by increasing the substrate temperature during the plasma irradiation. In this experiment, the conditions of the plasma irradiation other than the substrate temperature were as follows: the flow rate of the mixed gas of phosphine ($PH_3$) and 99% of hydrogen ($H_2$) was 10 sccm, the flow rate of argon gas was 50 sccm, the pressure was 63.3 Pa (475 mTorr), the RF power was 20 W and the plasma irradiation time was 1 minute. The XeCl excimer laser (wavelength of 308 nm) was used as the excimer laser in terms of the condition of the excimer laser anneal for activation and the XeCl excimer laser was irradiated sequentially with 98% overlap.

Figure 6:
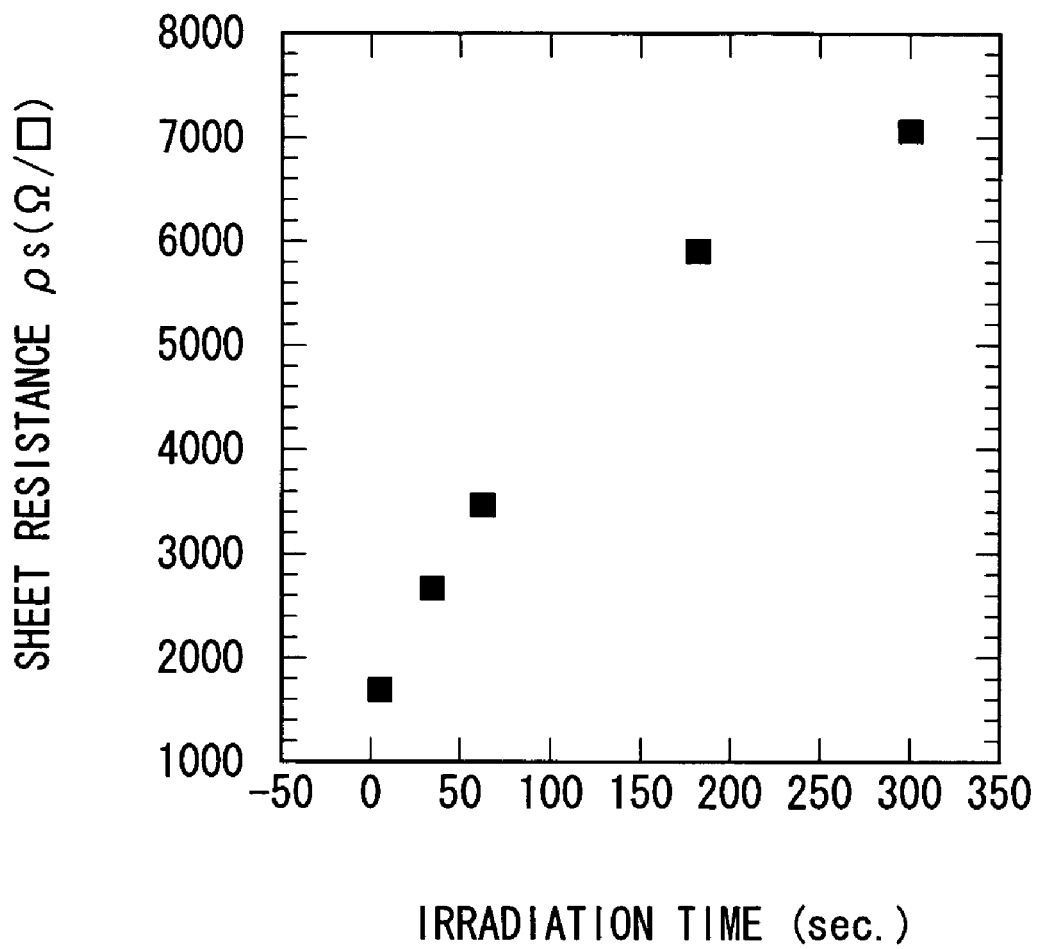
FIG. 6 is a characteristic view illustrating the relation of the treatment time of hydrogen plasma and the sheet resistance according to the example of the invention.

Furthermore, the hydrogen plasma treatment can be added to control the amount of the dopant ion adsorbed on the surface of the semiconductor layer. As shown in FIG. 6, after performing the plasma irradiation by use of the doping gas, the plasma irradiation by use of the hydrogen gas was performed to substitute the hydrogen ion for the phosphorus ion already adsorbed on the surface of the semiconductor thin film to control the amount of the adsorbed dopant ion. FIG. 6 shows the dependency of the hydrogen plasma irradiation of the sheet resistance $\rho_s$ ($\Omega/\square$). The horizontal axis indicates the irradiation time of hydrogen plasma (second) and the vertical axis indicates the sheet resistance $\rho_s$ ($\Omega/\square$). The longer the time of the hydrogen plasma treatment is, the higher the sheet resistance $\rho_s$ is. Therefore, the impurity diffusion region having a desired sheet resistance ($\Omega/\square$) can be formed by controlling the time of the hydrogen plasma treatment. In this experiment, the nonsingle crystal silicon film having a film thickness of 40 nm was used as the semiconductor film and the conditions of the plasma irradiation of doping gas were as follows: the flow rate of the mixed gas of phosphine ($PH_3$) and 99% of hydrogen ($H_2$) was 10 sccm, the flow rate of argon gas was 50 sccm, the pressure was 63.3 Pa (475 mTorr), the substrate temperature was 130° C., the RF power was 20 W and the plasma irradiation time was 1 minute. The conditions of hydrogen plasma irradiation were as follows: the flow rate of hydrogen gas ($H_2$) was 50 sccm, the pressure was 26.7 Pa (200 mTorr) and the RF power was 20 W. The XeCl excimer laser (wavelength of 308 nm) was used as the excimer laser in terms of the condition of the excimer laser anneal for activation and the XeCl excimer laser was irradiated sequentially with 98% overlap.

As apparent from the results of the above experiments, in the method for doping the semiconductor layer of the embodiment, the amount of the dopant ion adsorbed on the surface of the semiconductor layer is controlled. Specifically, this is controlled by diluting the dopant ion gas by flowing the gas which adsorb the hydrogen ion, changing the substrate temperature, controlling the flow rate or partial pressure of gas, further diluting the mixed gas of dopant ion gas and hydrogenous gas with the inert gas, and controlling the conditions of plasma irradiation such as substrate temperature or plasma irradiation time for adsorption. The amount of the dopant ion adsorbed on the surface of the semiconductor layer can be controlled by removing the dopant ion already adsorbed on the surface of the semiconductor layer by etching or the like, or adding the hydrogen plasma treatment.

Here, the LIMPID using the excimer laser will be described. Basically, this method is a method that dissolving impurity ion into the film by irradiation of energy beam like the excimer laser after ionizing the dopant gas and adsorbing the dopant ion on the surface of the semiconductor thin film. This specifically attracts the attention to achieve the process in a low temperature. In the method for doping the semiconductor layer of the embodiment, the amount of the dopant ion adsorbed on the surface of the semiconductor layer is controlled in a step of adsorbing the dopant, however, after the step, doping is performed with the same method as the LIMPID using the excimer laser.

Figure 7:
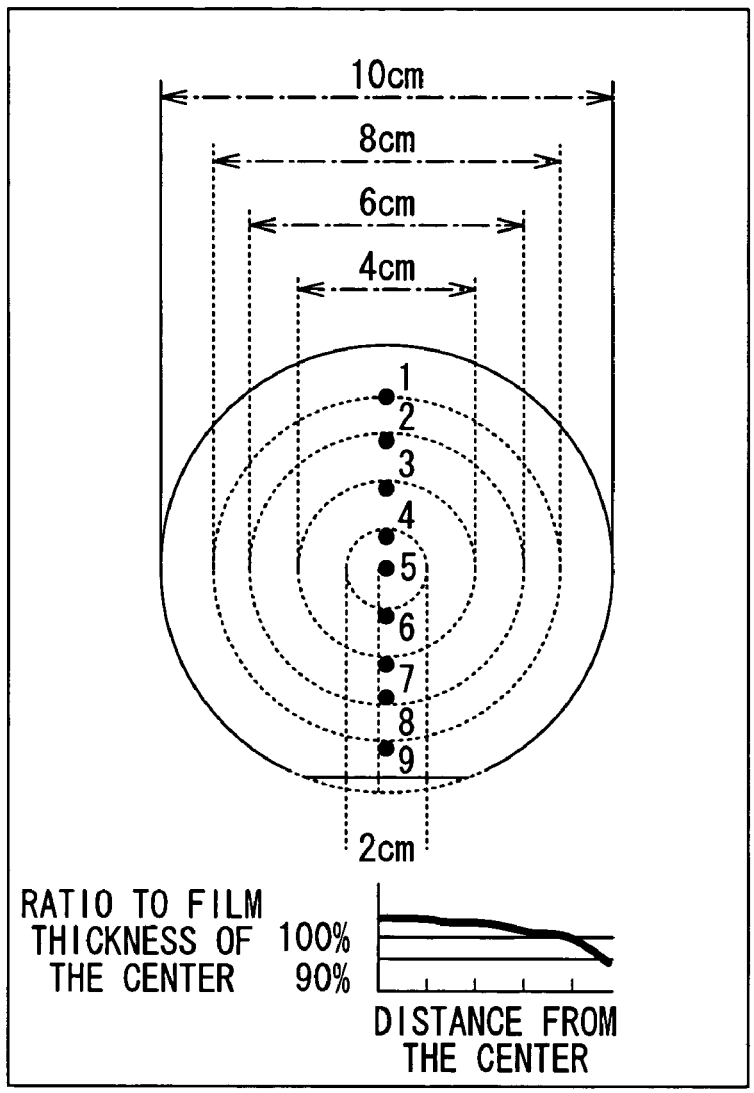
FIG. 7 is a view illustrating the distribution of film thickness inside a wafer after CVD deposition and the sheet resistance evaluation points.
Figure 8:
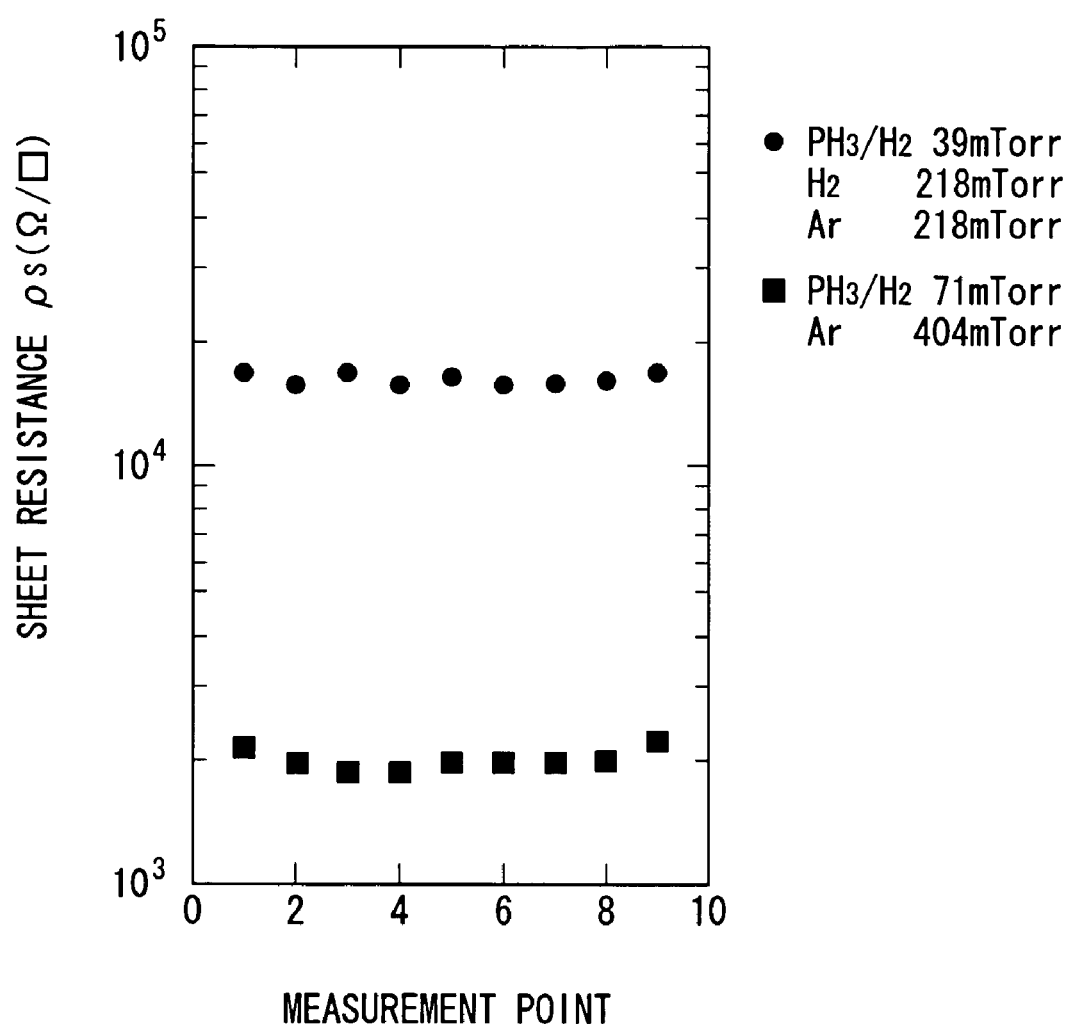
FIG. 8 is a view illustrating the in-plane distribution of the sheet resistance by LIMPID.

The LIMPID is excellent in the uniformity of doping in the surface and is especially suitable for diffusing the low concentration impurity. FIG. 7 shows the film thickness distribution when forming the thin film such as silicon with CVD apparatus and the dots indicated by number 1 to number 9 in the drawing is measurement point of the sheet resistance. The each distribution of the sheet resistance indicated by number 1 to number 9 is shown in FIG. 8. The distribution in the wafer surface was measured for a first gas with the partial pressure of the mixed gas of phosphine and hydrogen ($PH_3/H_2$) of 5.2 Pa (39 mTorr), the partial pressure of hydrogen gas of 29 Pa (218 mTorr) and the partial pressure of argon gas of 29.1 (218 mTorr), and for a second gas with the partial pressure of the mixed gas of phosphine and hydrogen ($PH_3/H_2$) of 9.5 Pa (71 mTorr) and the partial pressure of argon gas of 53.9 (404 mTorr). As seen in FIG. 8, the sheet resistance using the LIMPID is substantially uniform in the surface, thereby obtaining the good reproducibility.

Figure 9:
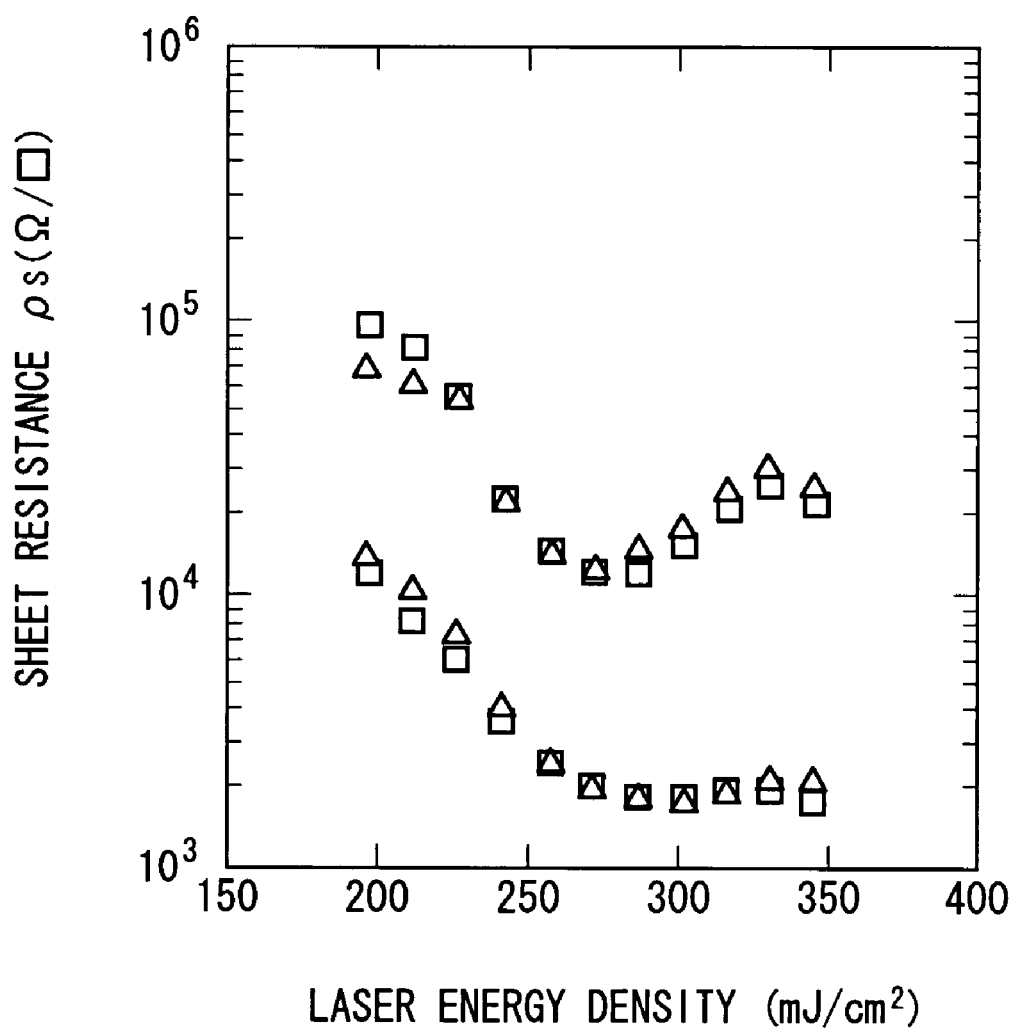
FIG. 9 is a view illustrating the sheet resistance in the case where the formation is repeatedly performed by LIMPID.

FIG. 9 shows a reproducibility of LIMPID and the fluctuation of the sheet resistance which was measured in the state where the amorphous silicon film was plated and the laser anneal was applied. In FIG. 9, the distribution of the upper part is a data of a first conditions: the flow rate of the mixed gas of phosphine and hydrogen ($PH_3/H_2$) is 9 sccm, the flow rate of the hydrogen gas is 92 sccm and the flow rate of the argon gas is 50 sccm, while the distribution of the lower part is a data of a second conditions: the flow rate of the mixed gas of phosphine and hydrogen ($PH_3/H_2$) is 9 sccm and the flow rate of the argon gas is 50 sccm. The data indicated by the triangles is the data reprocessed after 6 days from the data indicated by the squares. The data indicated by the triangles and the squares overlapped well and this exhibits that LIMPID can form the device excellent in the reproducibility.

The doping process of the invention is especially suitable for the process with a low temperature. For example, the plastic can be used as a material of the substrate. Here, the process using the plastic substrate will be described with reference to FIGS. 10A to 11C. In the embodiment, as an example, a p-channel type thin film transistor is formed on an insulating substrate and then it is used for an active device substrate of an active matrix display to fabricate a thin film semiconductor device. This can be used when forming an n-type channel type thin film transistor as well.

Figure 10A:
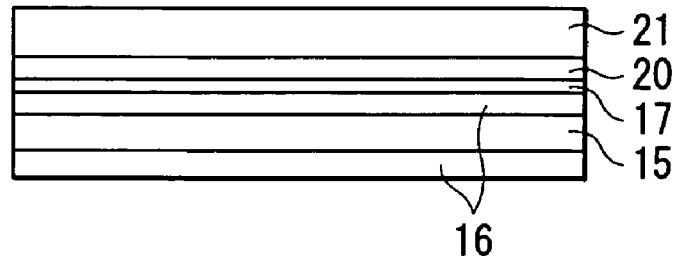
FIGS. 10A to 10C are views illustrating the steps of forming a thin film transistor as an embodiment of the method for doping the semiconductor layer of the invention.

First, in FIG. 10A, an organic polymeric material, so-called plastic material is used to form an insulating substrate 15. The plastic material used herein may include polyesters such as a polyethylene terephthalate, polyethylenenaphthalate and polycarbonate, polyolefines such as polypropylene, polyphenylene sulfides such as polyphenylene sulfide, polyamides, aromatic polyamides, polyether ketones, polyimides, acrylic resins, PMMA (Polymethyl Methacrylate), and the like. In particular, it is preferred to use a general-purpose plastic material such as polyethylene terephthalate, acetate, polyphenylene sulfide, polycarbonate, polyether sulfone, polystyrene, nylon, polypropylene, polyvinyl chloride, the acrylic resins, PMMA, and the like. Moreover, when using a film type as the insulating substrate 15, it is preferred that the film is extended by biaxial stretching in the light of mechanical stability and strength. Furthermore, a barrier layer 16 such as a silicon oxide film can be formed on the back side of the substrate for suppressing the hygroscopic property of the plastic plate. Therefore, deformation of the insulating substrate 15 can be suppressed in exposure to atmospheric pressure after being taken out of a vacuum apparatus and in the subsequent processes. As shown in FIG. 10A, the barrier layer 16 of silicon oxide can be formed on the front side of the insulating substrate 15 made of the plastic, which is more effective.

Moreover, it is desirable to pre-form a thermal buffer layer 20 on the insulating substrate 15. As the thermal buffer layer 20, it is preferred to form an inorganic material film such as a $SiO_2$ film or a $SiN_x$ film with a thickness of about 100 to 500 nm. At this time, it is more effective that a multilayer structure is constructed by forming another buffer layer 17, of an organic polymeric material such as an acrylic resin with a thermal softening point lower than that of the substrate, on the buffer layer 20, for the purpose of preventing film separation at the time of energy beam irradiation due to the difference in the thermal expansion between the organic polymeric material of the insulating substrate 15 and the inorganic material.

Figure 10B:
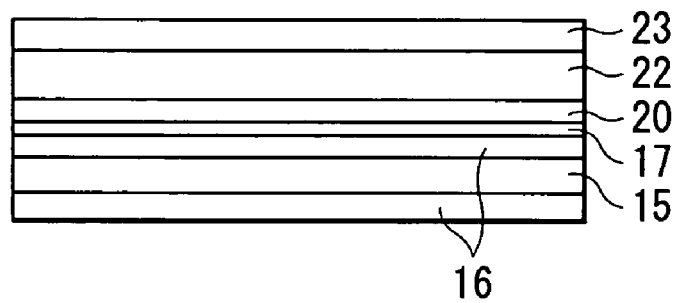

Then, an amorphous semiconductor thin film 21 which serves as an active layer of the transistor is formed on the upper surface of the insulating substrate 15 on which such heat resistant buffer layers 17 and 20 are already formed. In the embodiment, the amorphous semiconductor thin film is deposited to a thickness of about 20 to 100 nm using a sputtering apparatus as a deposition apparatus, at the substrate temperature set to 200° C. or below, preferably 150° C. or below, where the insulating substrate 15 may not be damaged. Then, a semiconductor polycrystal film 22 is formed by irradiating an energy beam, for example, an excimer laser, onto the insulating substrate 15 and crystallizing the amorphous semiconductor thin film 21. Also in the crystallization by the irradiation of the excimer laser, optimization of both time and the irradiation energy of the laser is required so that the temperature of the plastic of the insulating substrate 15 is kept at 200° C. or below, preferably 150° C. or below, where the plastic substrate may not be damaged. At this time, it is desirable to irradiate the laser beam repeatedly, for example, while the line-shaped laser beam, which energy density is set at about 300 mJ/cm$^2$, is scanning the substrate so that the irradiated parts partially overlap. The size of the line-shaped laser beam is, for example, 120 mm in longitudinal size and 0.5 mm in width. The laser beam is irradiated along the width direction with partially overlapping the irradiated parts, where the amount of the overlapping part (the overlapping amount) is set to 98%, for example. Then, a $SiO_2$ film used as a gate insulating film 23 is formed on the upper surface of the semiconductor polycrystal film 22 by reactive sputtering, as shown in FIG. 10B. Alternatively, another $SiO_2$ film may be subsequently formed on a $SiN_x$ film which is formed on the $SiO_2$ film and the stacked film may be used as the gate insulating film 23.

Then, a gate electrode 24 is formed on the gate insulating film 23. The gate electrode 24 is formed by depositing a metal film such as Al, Mo, Ta, Ti, Cr or the like, a polysilicon film into which high concentration impurities are doped, a laminated film of high concentration doped polysilicon and a metal, or an alloy film of the above mentioned materials and being patterned to a predetermined shape to form the gate electrode. Next, by using the gate electrode 24 as a mask, the insulating film 23 is patterned to the island shape, thereby the gate insulating film 23 of the thin film transistor is formed.

Figure 10C:
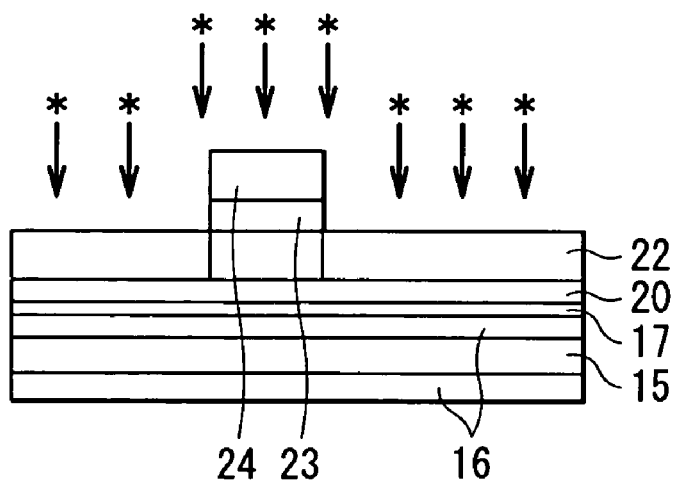

Subsequently, the LDD region is formed. As shown in FIG. 10C, the plasma is generated by using the mixed gas of doping gas and hydrogen gas or the mixed gas of inert gas and hydrogen gas, and make the doping ion and the hydrogen ion adsorb on the surface of the semiconductor polycrystal film 22. At this time, when the temperature of the surface of the semiconductor polycrystal film 22 is close to room temperature and the concentration of the hydrogen in the diluted gas is low, the dose increases. This increase becomes close to a certain concentration as time advances. This is because phosphorus is not easily adsorbed on the region where phosphorus was already adsorbed and the adsorption decreases as the coverage of phosphorus increases. In the embodiment, the substrate temperature is set to room temperature and the phosphorus ion is adsorbed on the surface by irradiating plasma for about 1 minute at 66.7 Pa (500 mTorr) with the source gas mixing $PH_3$ gas (diluting with $H_2$ to be the $PH_3$ concentration of 1%) of 9 sccm and hydrogen diluted gas of 100 sccm for doping and the RF power of 20 W. In the adsorption step, the amount of dopant ion adsorbed on the surface of the semiconductor polycrystal film 22 is controlled by controlling the flow rate of the diluted gas. However, it may be controlled by changing the substrate temperature, further diluting the mixed gas of dopant ion gas and hydrogenous gas with inert gas, controlling the conditions of plasma irradiation for adsorption such as substrate temperature or plasma irradiation time. In addition, it is possible to remove the dopant ion once adsorbed on the surface of the semiconductor polycrystal film 22 by etching or the like, and the hydrogen plasma treatment may be added to control the amount of the dopant ion adsorbed on the surface of the semiconductor polycrystal film 22.

Figure 11A:
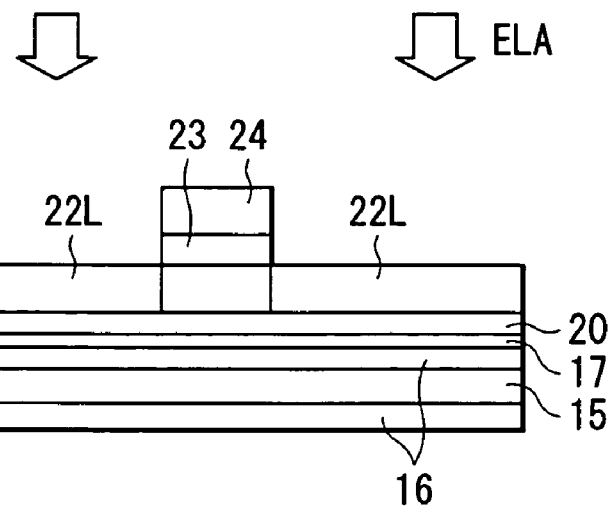
FIGS. 11A to 11C are views illustrating the steps of forming the thin film transistor as the embodiment of the method for doping the semiconductor layer of the invention, following the steps shown FIG. 10C.

After that, as shown in FIG. 11A, the energy beam is again irradiated to dissolve the dopant adsorbed on the surface of the semiconductor polycrystal film 22 and to activate it. At this time, as described above, the XeCl excimer laser (wavelength of 308 nm) is used as the energy beam and a laser having higher energy than the one used in the crystallization (microcrystallization) of the semiconductor thin film 21 is desirable. In the embodiment, the energy density of the laser beam is set to about 300 mJ/cm$^2$. Thereby, the region, which is not masked by the gate electrode 24, in the semiconductor polycrystal film is activated with low dose and a low concentration impurity region 22L is formed.

Figure 11B:
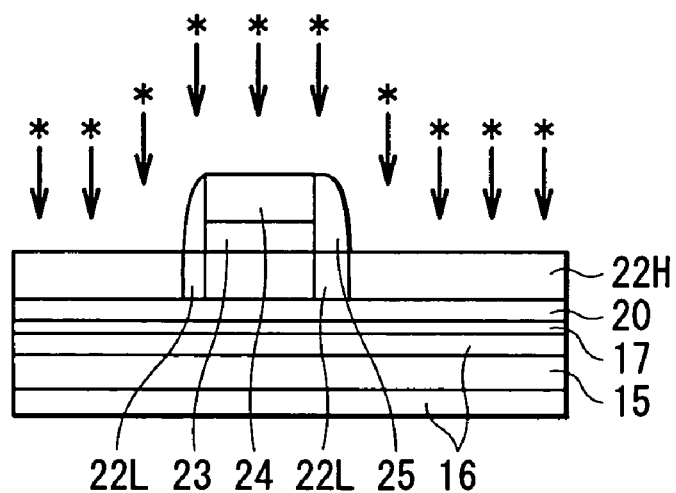

Then, sidewalls 25 are formed on the gate electrode 24. On the entire surface including the gate electrode 24, $SiO_2$ film is deposited by, for example, PE-CVD (Plasma Enhanced-Chemical Vapor Deposition). After that, as shown in FIG. 11B, the $SiO_2$ film is removed using the gate electrode 24 as a stopper to leave the $SiO_2$ film on the sides of the gate electrode 24 and the gate insulating film 23 to make the sidewalls 25 by anisotropic etching (for example, reactive ion etching (RIE)) or the like. The plasma is generated by using the mixed gas of doping gas and the hydrogen gas or the mixed gas of inert gas and hydrogen gas to be again adsorbed on the surface of the semiconductor polycrystal film using the gate electrode 24 and the sidewalls 25 as a mask. Then, heavy doping for forming a high concentration impurity region 22H is performed by again irradiating the energy beam such as XeCl excimer laser (wavelength of 308 nm) to dissolve the dopant adsorbed on the surface of the semiconductor polycrystal film (the low concentration impurity region 22L) and to activate it. In the embodiment, the substrate temperature is set to 120° C. and the phosphorus ion is adsorbed on the surface by irradiating plasma for about 1 minute at 66.7 Pa (500 mTorr) with the source gas mixing $PH_3$ gas (diluting with $H_2$ to be the $PH_3$ concentration of 1%) of 9 sccm and Ar diluted gas of 50 sccm for doping and the RF power of 20 W. The diluted gas can include other inert gas such as He gas, Ne gas or the like. The energy beam is irradiated as described above and the energy density of the laser beam is set at about 310 mJ/cm$^2$ in the example. Therefore, the region where is not masked with the gate electrode 24 and the sidewalls 25 in the semiconductor polycrystal film is activated at high dose. The dopant for forming the high concentration impurity region 22H and the low concentration impurity region 22L may be the same or different dopant than phosphorus.

Figure 11C:
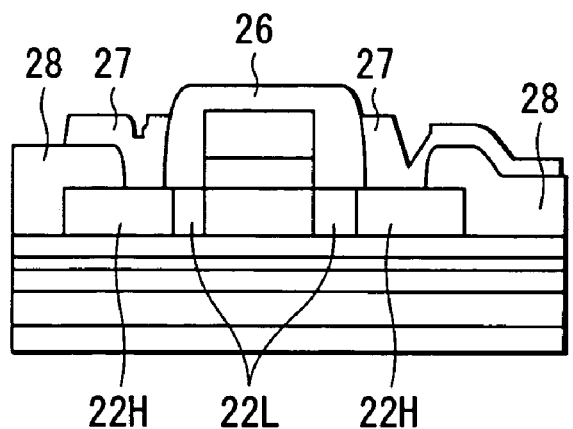

After activating the high concentration impurity region 22H, it is selectively removed except the regions become the source and drain regions by etching. Then, an interlayer insulating film 28 is formed and the required contact hole is formed. On the insulating film 28, an aluminum film is formed with a thickness of about 1 $\mu$m and patterned to a predetermined shape to form a wiring electrode 27 as shown in FIG. 11C. The wiring electrode 27 is connected to the source and drain regions through the contact hole. Next, the $SiO_2$ film is formed with a thickness of about 400 nm to form a passivation film. The passivation film covers the thin film transistor and the wiring electrode 27. Then, if required, the so-called hydrogenation treating is carried out by heating the substrate in the region of a heat resistant temperature of the substrate, and diffusing the hydrogen atoms contained in the interlayer insulating film 28 into the semiconductor polycrystal film by using the passivation film as a cap film.

Figure 12:
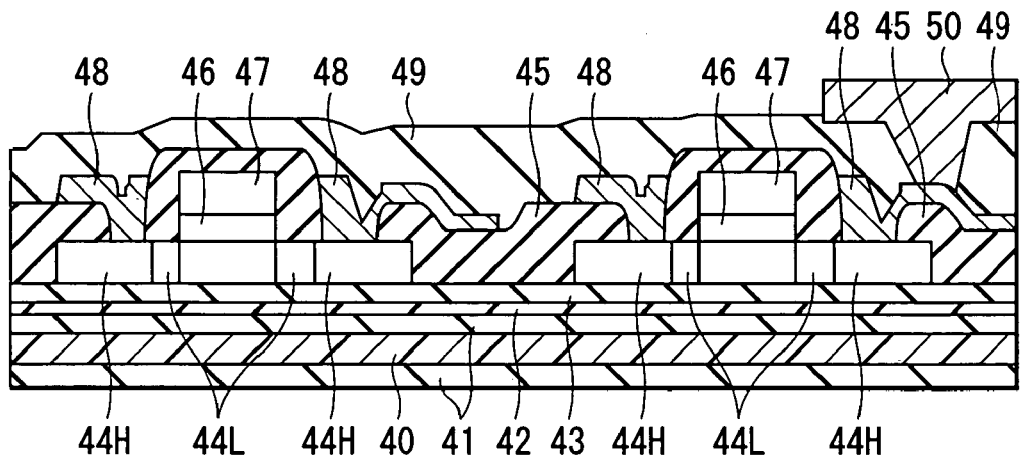
FIG. 12 is a sectional view illustrating the device structure of thin film transistor which is formed according to the method for manufacturing the thin film semiconductor device of the invention.

FIG. 12 is a sectional view of a device in the case of composing an active matrix display. Barrier layers 41 made of, for example, oxidized silicon are formed on both sides of an insulating substrate 40 made from plastic, and a heat resistant buffer layers 42 and 43 of the insulating substrate 40 of plastic are laminated and a semiconductor thin film comprising a high concentration impurity region 44H and a low concentration impurity region 44L are formed thereon. In particular, the low concentration impurity region 44L controls the amount of dopant ion adsorbed on the surface of the semiconductor thin film by controlling the flow rate of the dilute gas. The low concentration impurity region 44L may be controlled to be a certain low concentration by changing the substrate temperature, further diluting the mixed gas of the dopant ion gas and the hydrogenous gas with the inert gas, controlling the conditions of the plasma irradiation for adsorption such as substrate temperature or plasma irradiation time.

On the channel region between a pair of low concentration impurity regions 44L, a gate electrode 47 is formed with a silicon oxide film 46 in between. A wiring electrode layer 48 is connected to the source and drain regions (high concentration impurity region 44H) of the thin film transistor through the contact hole provided in an interlayer insulating film 45. A transparent conductive film made of ITO (Indium Tin Oxide) or the like is formed on a surface of a passivation film 49 and patterned into a predetermined shape to form a pixel electrode 50. The pixel electrode 50 is pre-connected to the wiring electrode layer 48 and to the source and drain regions of the thin film transistor trough the contact hole preformed in the passivation film 49 and the interlayer insulating film 45. When composing the active matrix liquid crystal display using the thin film semiconductor device as the active device substrate, another insulating substrate on which preformed the facing electrode is connected to the insulating substrate 40 with a certain space and electro-optic substance such as liquid crystal or the like is placed to the space.

In the above described embodiment, the method for doping the semiconductor layer and the method for manufacturing the thin film semiconductor device using the same are described. This is the method to improve the resistance of the semiconductor layer with good controllability, so it may be applied for controlling the resistance of the resistance layer taking advantage of the step of controlling the amount of the dopant ion adsorbed on the surface of the semiconductor thin film.

As described above, according to the method for doping the semiconductor layer of the invention, the low concentration impurity diffusion region can be formed with good controllability even in case of using the low heat resistant substrate and particularly, the low concentration impurity region of the LDD structure in the thin film transistor can be formed with good controllably.

Obviously many modifications and variations of the present invention are possible in the light of the above teachings. It is therefore to be understood that within the scope of the appended claims, the invention may be practiced otherwise than as specifically described.

What claimed is:

1. A method for doping a semiconductor layer comprising the steps of:
   forming a semiconductor layer on a substrate;
   adsorbing dopant ion on a surface of the semiconductor layer and controlling the amount of the adsorption; and
   activating the adsorbed dopant ion in the semiconductor layer,
   wherein,
   the amount of the dopant ion adsorbed on the surface of the semiconductor layer is controlled by controlling a rate of termination in a dangling bond of a material which forms the semiconductor layer, and
   the rate of termination in the dangling bond is controlled by diluting an adsorbed dopant ion gas with a gas containing hydrogen with dopant ion of 1% or less.

2. A method for doping a semiconductor layer according to claim 1, wherein the rate of termination in the dangling bond is controlled by changing a substrate temperature on which the semiconductor layer is formed.

3. A method for doping a semiconductor layer according to claim 1, wherein the rate of termination in the dangling bond is controlled by diluting the adsorbed dopant ion gas with a mixed gas of a gas containing hydrogen and an inert gas.

4. A method for doping a semiconductor layer according to claim 1, wherein the rate of termination in the dangling bond is controlled by controlling plasma irradiation conditions onto the adsorbed dopant ion.

5. A method for doping a semiconductor layer according to claim 1, wherein the amount of the dopant ion adsorbed on the surface of the semiconductor layer is controlled by selectively removing the dopant ion adsorbed on the surface of the semiconductor layer by etching.

6. A method for doping a semiconductor layer according to claim 1, wherein the dopant ion is phosphorus ion.

7. A method for doping a semiconductor layer according to claim 1, wherein the semiconductor layer is formed of a silicon as a main material.

8. A method for doping a semiconductor layer according to claim 1, wherein the semiconductor layer is crystallized before a step of adsorbing the dopant ion.

9. A method for doping a semiconductor layer according to claim 1, wherein the substrate is a low heat resistant substrate with a heat resistant temperature of 200° C. or below.

10. A method for doping a semiconductor layer according to claim 9, wherein the low heat resistant substrate is a substrate of an organic polymeric material.

11. A method for doping a semiconductor layer according to claim 1, wherein the dopant ion is activated with laser anneal, furnace anneal or lamp anneal or combination thereof.

12. A method for doping a semiconductor layer according to claim 1, wherein the dopant ion is introduced with a state adsorbed on a surface of a semiconductor layer by laser irradiation and activated.

13. A method for manufacturing a thin film semiconductor device comprising the steps of:

forming a semiconductor layer on a substrate;

adsorbing dopant ion on a surface of the semiconductor layer and controlling the amount of the adsorption; and activating the adsorbed dopant ion in the semiconductor layers, wherein, the amount of the dopant ion adsorbed on the surface of the semiconductor layer is controlled by controlling a rate of termination in a dangling bond of a material which forms the semiconductor layer, and the rate of termination in the dangling bond is controlled by diluting an adsorbed dopant ion gas with a gas containing hydrogen with dopant ion of 1% or less.

14. A method for manufacturing a thin film semiconductor device according to claim 13, wherein the semiconductor layer is a device region of a thin film transistor with SOI structure and a region by which the amount of the dopant ion is controlled constitute a low concentration impurity diffusion region of the thin film transistor.

15. A method for manufacturing a thin film semiconductor device according to claim 13, wherein the substrate is a low heat resistant substrate with a heat resistant temperature of 200° C. or below.

16. A method for manufacturing a thin film semiconductor device according to claim 14, wherein the heat resistant substrate is a substrate of an organic polymeric material.

* * * * *

UNITED STATES PATENT AND TRADEMARK OFFICE
CERTIFICATE OF CORRECTION

| | |
|---|---|
| PATENT NO. | : 6,984,552 B2 |
| APPLICATION NO. | : 10/433849 |
| DATED | : January 10, 2006 |
| INVENTOR(S) | : Akio Machida, Setsuo Usui and Dharam Pal Gosain |

It is certified that error appears in the above-identified patent and that said Letters Patent is hereby corrected as shown below:

Col. 16, Claim 17, insert

--17. A method for controlling resistance of a semiconductor layer comprising the steps of: adsorbing dopant ion on a surface of a semiconductor layer and controlling the amount of adsorption; and activating dopant ion in the semiconductor layer.--

Signed and Sealed this

Nineteenth Day of December, 2006

JON W. DUDAS
*Director of the United States Patent and Trademark Office*